United States Patent [19]

Kuriyama et al.

[11] Patent Number: 5,262,919
[45] Date of Patent: Nov. 16, 1993

[54] SEMICONDUCTOR MEMORY DEVICE INCLUDING PROGRAMMING CIRCUITRY

[75] Inventors: Masao Kuriyama, Kawasaki; Shigeru Atsumi, Tokyo; Junichi Miyamoto, Yokohama, all of Japan

[73] Assignee: Kabushiki Kaisha Toshiba, Kawasaki, Japan

[21] Appl. No.: 709,825

[22] Filed: Jun. 4, 1991

[30] Foreign Application Priority Data

Jun. 5, 1990 [JP] Japan ................................. 2-145408

[51] Int. Cl.⁵ ............................................. G11C 7/00
[52] U.S. Cl. ............................ 365/189.05; 365/189.08
[58] Field of Search ...................... 365/189.01, 189.05, 365/189.08

[56] References Cited

U.S. PATENT DOCUMENTS 4,953,129 8/1990 Kobayashi et al. ......... 365/189.05 X

OTHER PUBLICATIONS

ISSCC Dig. Tech. Papers, "A 25 ns 16K CMOS PROM Using a 4-Transistor Cell" pp. 162-163 (Feb. 1985).

Primary Examiner—Steven Mottola
Attorney, Agent, or Firm—Banner, Birch, McKie & Beckett

[57] ABSTRACT

A data input circuit outputs input data in accordance with a write enable signal. A program control circuit generates different data items on the basis of the input data output from the data input circuit and the write enable signal, and turns programming transistors on/off in accordance with the different data items as generated. The programming transistors are connected to a pair of cell transistors forming an EPROM cells, and program into these cell transistors the different data items generated by the write control circuit. A timing circuit delays the timing at which the write enable signal is supplied to the write control circuit, until the input data is established within the data input circuit.

11 Claims, 3 Drawing Sheets

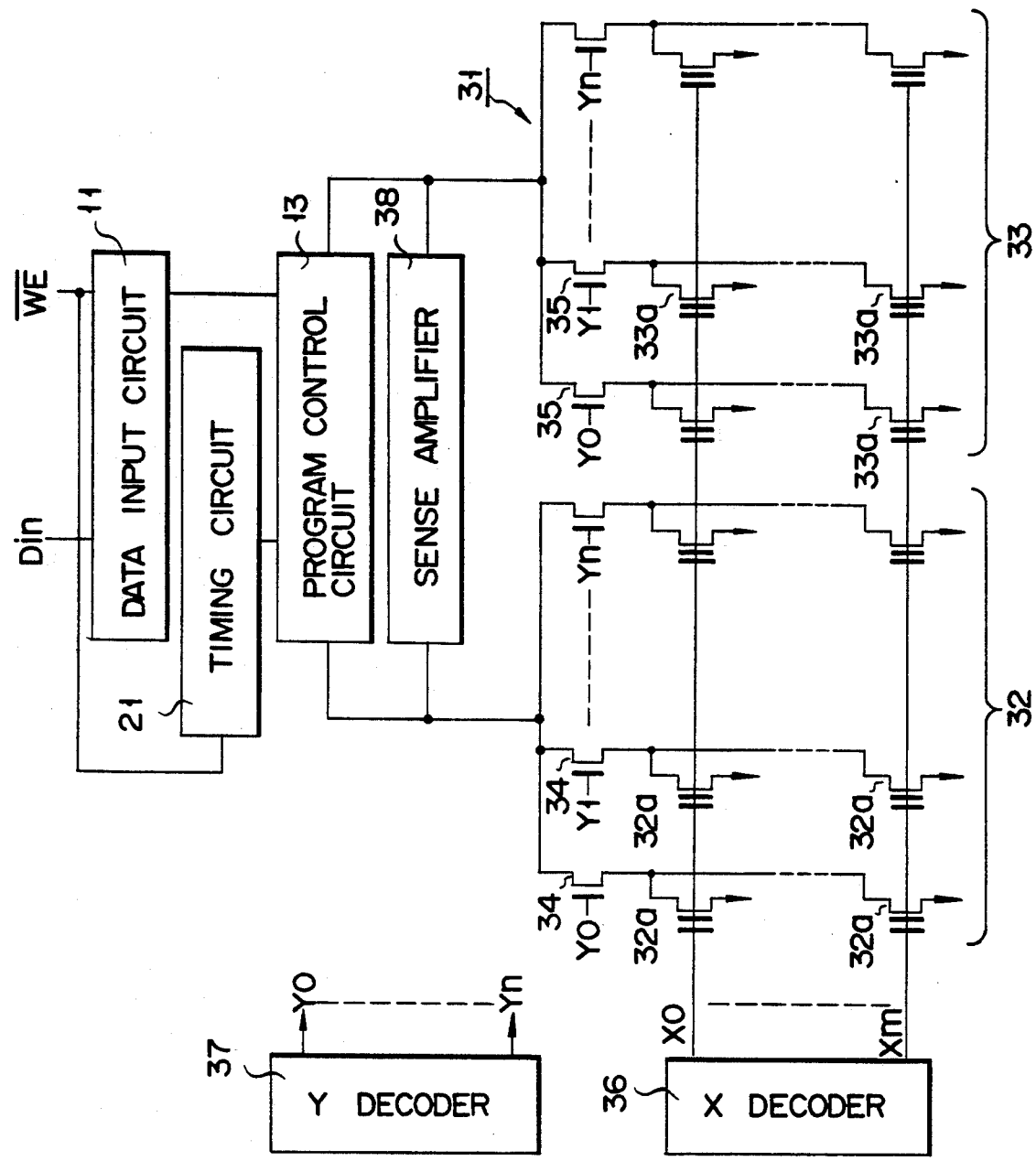
F I G. 1

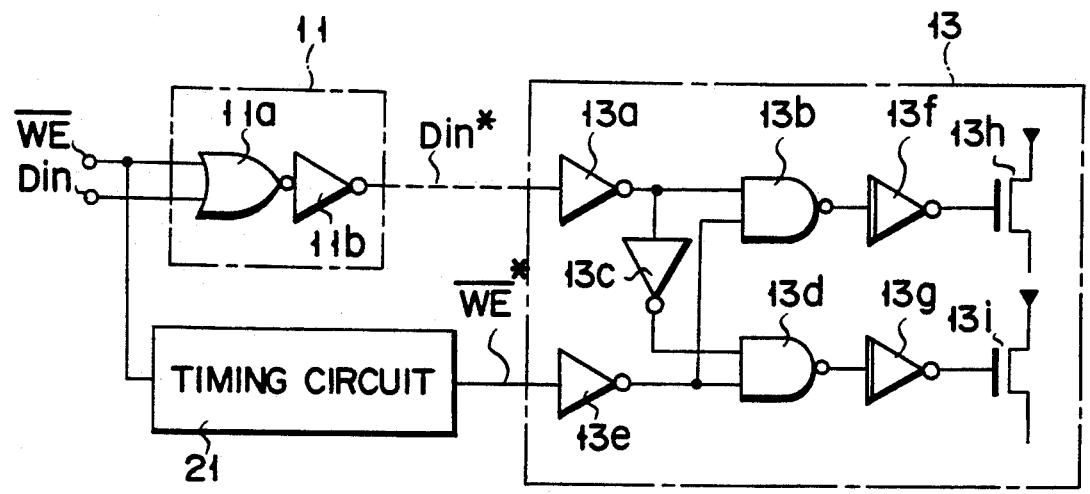
F I G. 2
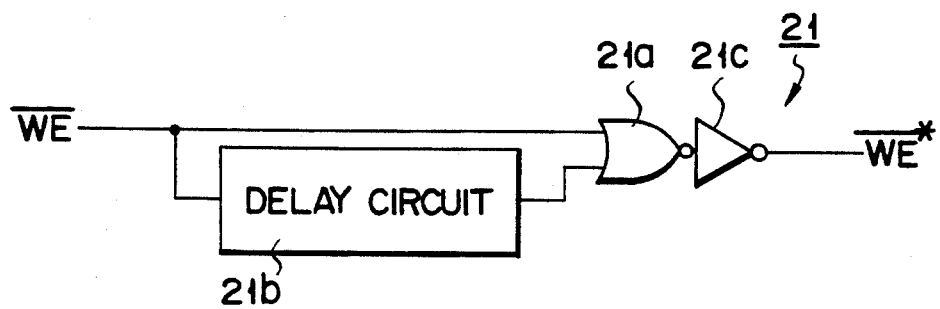
F I G. 3
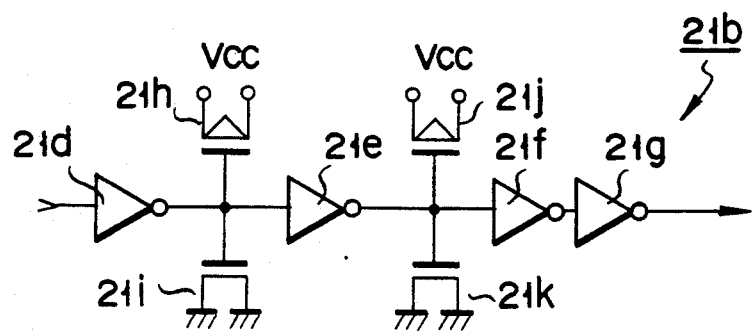
F I G. 4

SEMICONDUCTOR MEMORY DEVICE INCLUDING PROGRAMMING CIRCUITRY

BACKGROUND OF THE INVENTION

1. Field of the Invention

This invention relates to a programing circuit for programming data into, for example, an EPROM (Erasable Programmable Read Only Memory), and more particularly to a programming circuit for use in a nonvolatile semiconductor memory device comprising a plurality of memory cells (hereinafter referred to as differential cells), each including a pair of cell transistors into which different data items are programmed in accordance with input data.

2. Description of the Related Art

When data is programmed an EPROM cell, for example, a high voltage is applied to the drain and control gate of the cell transistor included in the cell array, such that hot electrons flow from a channel region into the floating gate of the cell transistor, raising the threshold voltage of the cell transistor.

FIG. 5 shows a conventional programming circuit. A data input circuit 11 includes a NOR circuit 11a and an inverter circuit 11b which are connected in series. A write enable signal $\overline{WE}$ (holding the level "L" in a programming mode) and input data Din are supplied to the NOR circuit 11a. A program control circuit 12 is connected to the output terminal of the data input circuit 11. The program control circuit 12 includes a level shift inverter circuit 12a and a programming transistor 12b. The level shift inverter circuit 12a, whose input terminal is connected to the output terminal of the inverter circuit 11b, converts a 5 V signal into a 12.5 V signal, for example. The gate, drain, and source of the programming transistor 12b are respectively connected to the output terminal of the level shift inverter circuit 12a, a power supply $V_{pp}$, and the drain of the cell transistor included in a memory cell (not shown).

The circuit shown in FIG. 6, for example, is employed as the level shift inverter circuit 12a.

In FIG. 6, an N-channel transistor N1 and a P-channel transistor P1 form an inverter circuit, the current path of the transistor N1 and that of the transistor P1 connected in series. The gate of the transistor N1 is connected to an input terminal IN, and the sources of the transistors N1 and P1 both are connected to an output terminal OUT. Transistors N2 and N3, whose current paths are connected in series between the input terminal IN and the gate of the transistor P1, are protection transistors which cut the current path between $V_{cc}$ and $V_{PP}$. The gate of the transistor N2 is connected to a power supply $V_{cc}$ of e.g. 5 V. The gate of the transistor N3 and the source of the transistor P1 are coupled via a transistor N4 to a power supply $V_{pp}$ of e.g. 12.5 V. Transistors P2 and N5, which are connected to the gate of the transistor N3 and the sources of the transistors P1 and P3, form a leak circuit which keep the source level of transistors P1 and P3 stable. Further, a transistor P3 is connected between the source and gate of the transistor P1, and the gate of the transistor P3 is connected to the output terminal OUT. The transistor P3 is designed to feed back an output voltage to the gate of the transistor P1 so as to certainly turn the transistor P1 off when a signal having the level "1" is input from the input terminal IN.

When data is programmed into a cell transistor (not shown), the data input circuit 11 shown in FIG. 5 generates input data Din* on the basis of a write enable signal $\overline{WE}$ and the input data Din. The data Din* as generated is supplied to the transistor 12b through the level shift inverter circuit 12a such that the transistor 12b is turned on/off, thus allowing data to be programmed into the cell transistor.

When differential cells are used as memory cells, the program control circuit 13 shown in FIG. 7 is conventionally employed. The same circuit elements as those shown in FIG. 5 will be denoted by the same reference numerals in FIG. 7, and only the circuit elements which are not shown in FIG. 5 will be described in the following.

In the program control circuit 13 shown in FIG. 7, the input terminal of an inverter circuit 13a is connected to the output terminal of the data input circuit 11. The output terminal of the inverter circuit 13a is connected to one input terminal of a NAND circuit 13b, as well as to one input terminal of a NAND circuit 13d via an inverter circuit 13c. The input terminal of an inverter circuit 13e is connected to one input terminal of the NOR circuit 11a. The output terminal of the inverter circuit 13e is connected to the other input terminal of the NAND circuit 13b, and also to the other input terminal of the NAND circuit 13d. The write enable signal $\overline{WE}$ is supplied to the NAND circuits 13b and 13d through the inverter circuit 13e. The output terminal of the NAND circuit 13b is connected to the gate of a programming transistor 13h via a level shift inverter circuit 13f, while the output terminal of the NAND circuit 13d is connected to the gate of a writing transistor 13i via a level shift inverter circuit 13g. The configuration of each of the level shift inverter circuits 13f and 13g is as shown in FIG. 6.

In a programming mode, the program control circuit 13 programs different data into a pair of cell transistors in accordance with input data. In a non-programming mode, the program control circuit 13 prevents a high voltage from being applied to the drains of the cell transistors, by using the write enable signal $\overline{WE}$.

In the programming mode, the write enable signal may hold the level "H", depending upon the circuit logic employed.

Incidentally, a pair of cell transistors included in a differential cell have the same low threshold voltage before data is programmed therein. That is, the cell transistors are both in the "1" state. When data is programmed into the differential cell, two different data are generated by the program control circuit 13 in accordance with the input data. The different data as generated are programmed into the cell transistors by a programming transistor.

In the conventional programming circuit shown in FIG. 7, the data input circuit 11 and the program control circuit 13 are simultaneously placed in an operation state by the write enable signal $\overline{WE}$. In practice, however, after the program control circuit 13 has been placed in an operation state, there is a time until the data input circuit 11 outputs the data Din* (this will be hereinafter referred to as "until the input data Din* is established within the data input circuit 11"). If there is a relatively long time until the input data Din* is established, a pair of cell transistors may be erroneously programmed. The data is temporarily written into the erroneously selected cell transistor of paired cell transistors, as a result of which the threshold voltage of one of them increases. Thereafter, when the input data Din* is established, the cell transistor in which the data is to be programmed is selected and the data is programmed therein, with the result that the threshold voltage of one of them increases. The cell transistor, whose threshold voltage has increased, is in the "0" state.

Thus, when a cell transistor of a paired cell transistors is erroneously selected and data is programmed into the cell transistor selected, the threshold voltage of erroneously selected cell transistor increases and remains as is. The cell transistor whose threshold voltage has thus substantially increased is in the "0" state, while the other cell transistor is in the "1" state. In this case, the difference between the threshold voltages of the two cell transistors is smaller than that between the threshold voltages of another pair of cell transistors in which data has been programmed without a write error.

When data is read out from a differential cell, the difference between the threshold voltages of the cell transistors included in the differential cell is detected as the difference between the currents flowing through the cell transistors. A sense amplifier amplifies the current difference and outputs it as data. If, however, the difference between the threshold voltages of the cell transistors is small, the sense amplifier cannot detect it, resulting in a low read-out speed or incorrect data being output from the sense amplifier.

SUMMARY OF THE INVENTION

It is therefore the object of the present invention to provide a programming circuit which is used in a nonvolatile semiconductor memory device and by which input data is accurately and reliably programmed into cell transistors.

To attain the above object, the programmed circuit of the present invention comprises a data input circuit to which input data is supplied; nonvolatile cell transistors into which data is programmed in accordance with the input data; a programming transistor, connected to the cell transistors, for programming data therein in accordance with the input data output from the data input circuit; and a timing circuit for delaying the timing at which the programming transistor is turned on, until the input data is established within the data input circuit.

According to the present invention, the timing at which the programming transistor is turned on is delayed by the delay circuit until the input data is established within the data input circuit, thus preventing a program error, a read-out speed from being lowered, and incorrect data from being output.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a diagram showing the configuration of the programming circuit according to an embodiment of the present invention;

FIG. 2 is a diagram showing the configuration of a part of the circuit shown in FIG. 1;

FIG. 3 is a diagram showing the configuration of one of the circuit elements shown in FIG. 2;

FIG. 4 is a diagram showing the configuration of one of the circuit elements shown in FIG. 3;

DETAILED DESCRIPTION OF THE PREFERRED EMBODIMENTS

Figure 5:
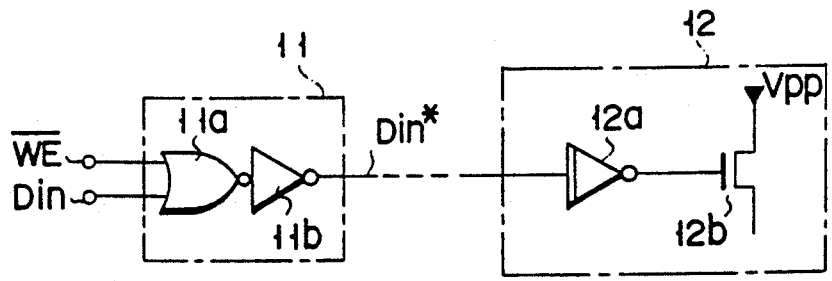
FIG. 5 is a diagram showing the configuration of a conventional programming circuit.

An embodiment of the present invention will now be described in the following, with reference to the drawings.

In FIG. 1, a differential cell array 31 comprises a first memory cell array 32 and a second memory cell array 33. The first memory cell array 32 includes EPROM cells 32a and transistors 34 used for selection of the cells 32a. On the other hand, the second memory cell array 33 includes EPROM cells 33a and transistors 35 used for selection of the cells 33a. The control gates of the cells 32a and 33a are connected to an X decoder 36, and the gates of the transistors 34 and 35 are connected to a Y decoder 37. A selection is performed among the cells 32a and 33a by the X and Y decoders 36 and 37. More precisely, a pair of memory cells are selected from the first and second memory cell arrays 32 and 33 by the X and Y decoders 36 and 37.

The first and second memory cell arrays 32 and 33 are connected to a sense amplifier 38 and a program control circuit 13. The sense amplifier 38 amplifies the difference between the currents output from a pair of memory cells which are selected from the first and second memory cell arrays 32 and 33, and outputs the amplified difference as data. One input terminal of the program control circuit 13 is connected to the output terminal of a data input circuit 11. A write enable signal $\overline{WE}$ (holding the level "L" in a programming mode) is supplied to one input terminal of the data input circuit 11, and input data Din is supplied to the other input terminal of the data input circuit 11. A timing circuit 21 is provided between one of the two input terminals of the data input circuit 11 and the other input terminal of the program control circuit 13.

The configuration of each of the data input circuit 11, the program control circuit 13, and the timing circuit 21 will be described below, with reference to FIG. 2.

In FIG. 2, the data input circuit 11 includes a NOR circuit 11a and an inverter circuit 11b which are connected in series. The write enable signal $\overline{WE}$ is supplied to one input terminal of the NOR circuit 11a, and the input data Din is supplied to the other input terminal of the NOR circuit 11a. The output terminal of the NOR circuit 11a is connected to the program control circuit 13 via the inverter circuit 11b.

In the program control circuit 13, the input terminal of an inverter circuit 13a is connected to the output terminal of the data input circuit 11, i.e. the output terminal of the inverter circuit 11b. The output terminal of the inverter circuit 13a is connected to one input terminal of a NAND circuit 13b, and also to one input terminal of a NAND circuit 13d via an inverter circuit 13c.

Further, one of the two input terminals of the NOR circuit 11a included in the data input circuit 11 is connected to the input terminal of an inverter circuit 13e via the timing circuit 21. In the case where the write enable signal $\overline{WE}$ changes from the level "H" to "L", the timing circuit 21 delays output of the write enable signal $\overline{WE}$ until the input data is established within the data input circuit 11. In the case where the write enable signal $\overline{WE}$ changes from the level "L" to "H", the timing circuit 21 outputs the write enable signal $\overline{WE}$ without delaying it.

Figure 6:
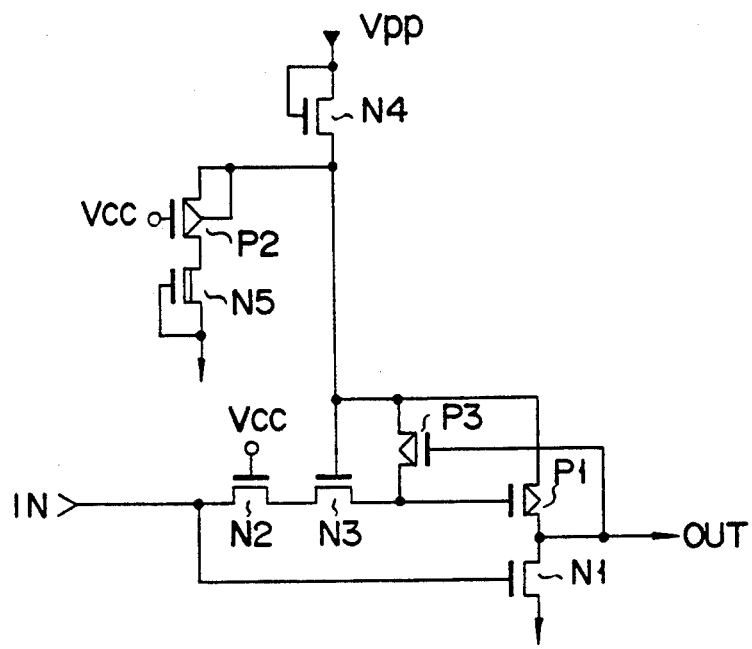
FIG. 6 is a diagram showing an example of a level shift circuit.
Figure 7:
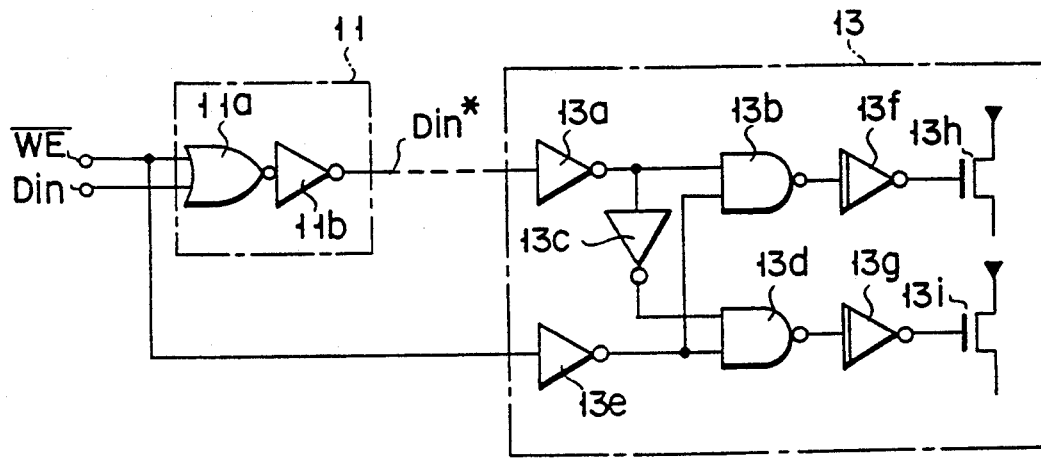
FIG. 7 is a diagram showing the configuration of a conventional programming circuit which differs in type from that shown in FIG. 5.

The output terminal of the inverter circuit 13e is connected to the input terminal of the NAND circuit 13b and also to the other input terminal of the NAND circuit 13d. The output terminal of the NAND circuit 13b is connected to the gate of a programming transistor 13h via a level shift inverter circuit 13f, while the output terminal of the NAND circuit 13d is connected to the gate of a programming transistor 13i via a level shift inverter circuit 13g. The drains of the programming transistors 13h and 13i are connected to a power supply $V_{pp}$, and the sources of the transistors 13h and 13i are connected to a pair of cell transistors forming a differential cell. In addition, the configuration of each of the level shift inverter circuits 13f and 13g is as shown in FIG. 6.

FIG. 3 is a diagram showing an example of the timing circuit 21.

The write enable signal $\overline{WE}$ is supplied to one input terminal of a NOR circuit 21a, and also to the other input terminal of the NOR circuit 21a via a delay circuit 21b. An inverter circuit 21c is connected to the output terminal of the NOR circuit 21a.

FIG. 4 is a diagram showing an example of the delay circuit 21b.

The delay circuit 21b includes inverter circuits 21d-21g which are connected in series, a P-channel transistor 21h whose gate is connected between the inverter circuits 21d and 21e, an N-channel transistor 21i, a P channel transistor 21j whose gate is connected between the inverter circuits 21e and 21f, and an N-channel transistor 21k.

The delay time of the delay circuit 21b described above is determined by the capacitances of the gates of the transistors 21h-21k.

When the write enable signal $\overline{WE}$ changes from the "H" level to "L" in the timing circuit 21 shown in FIG. 3, a change in the signal level at that one of the two input terminals of the NOR circuit 21a which is connected to the output terminal of the delay circuit 21b occurs the above delay time later than a change in the signal level at the other input terminal of the NOR circuit 21a. As a result, the write enable signal $\overline{WE}$* which is output from the timing circuit 21 changes from the level "H" to "L" after the lapse of the above delay time. Therefore, in the program control circuit 13 which receives the write enable signal $\overline{WE}$*, a selection of a pair of cell transistors is performed in accordance with an established input data Din* supplied from the data input circuit 11. The data is programmed into the cell transistors thus selected.

On the other hand, when the write enable signal $\overline{WE}$ changes from the level "L" to "H", a change in the signal level at that one of the two input terminals of the NOR circuit 21a which is connected to the output terminal of the delay circuit 21b occurs the above delay time 5 later than a change in the signal level at the other input terminal of the NOR circuit 21a. However, the write enable signal $\overline{WE}$* which is output from the timing circuit 21 changes to the level "H" simultaneously with the level change from "L" to "H" in the write enable signal $\overline{WE}$. As a result, a writing operation of program control circuit 13 is stopped as soon as the write enable signal $\overline{WE}$ changes to the level "H".

Thus, until the input data is established within the data input circuit 11, the write enable signal $\overline{WE}$ which is supplied to the program control circuit 13 is delayed by the timing circuit 21 and is supplied to the program control circuit 13. This enables data to be programmed into only one transistor of the paired transistors into which data is to programmed written, thus preventing a program error.

Further, the write enable signal $\overline{WE}$* which is output from the timing circuit 21 changes to the level "H" simultaneously with the level change from "L" to "H" in the write enable signal $\overline{WE}$. Accordingly, the programming mode can be quickly changed to the non-programming mode.

The configuration of each of the timing circuits 21 and the delay circuit 21b is not limited to that described in the above embodiment.

Needless to say, various modifications are possible without departing from the scope of the present invention.

What is claimed is:

1. A semiconductor memory device, comprising:
   a data input circuit having an input terminal for receiving input data and an output terminal for outputting data corresponding to the input data;
   memory cells for storing data;
   programming means having an operational state for programming data corresponding to the data at said output terminal of said data input circuit into said memory cells; and
   a timing circuit for delaying the operational state of said programming means until data is output at said output terminal of said data input circuit.

2. The semiconductor memory device according to claim 1, wherein said memory cells comprise memory cell pairs for storing complementary data in accordance with said input data.

3. The semiconductor memory device according to claim 1, wherein said timing circuit comprises:
   a delay circuit for delaying a write enable signal until data is output at said output terminal of said data input circuit; and
   a logic circuit, having two input terminals to one of which the write enable signal is supplied, and to the other of which a write enable signal delayed by said delay circuit is supplied, for immediately outputting the write enable signal when it indicates a non-programming mode, and for outputting the write enable signal in accordance with a delay time of said delay circuit, when the write enable signal indicates a programming mode.

4. The semiconductor memory device according to claim 3, wherein said logic circuit includes a NOR circuit.

5. A semiconductor memory device, comprising:
   a data input circuit having a first input terminal for receiving input data $D_{in}$, a second input terminal for receiving a write enable signal WE, and an output terminal for outputting data $D_{in}$* corresponding to said input data $D_{in}$ in response to a first level of the write enable signal WE;
   first and second memory cell arrays each comprising memory cells arranged in a row and column matrix;
   programming means having an operational state for programming, in accordance with the data $D_{in}$*, a first data item into a memory cell in said first memory cell array and a second data item into a memory cell in said second memory cell array, said programming means having a first input terminal receiving the data $D_{in}*$ at said output terminal of said data input circuit and a second input terminal receiving a write enable signal WE*, the operational state of said programming means being initiated in response to a first level of the write enable signal WE*; and a timing circuit having an input terminal for receiving the write enable signal WE and an output terminal for outputting the write enable signal WE* to said second input terminal of said programming means, said timing circuit responsive to the first level of the write enable signal WE for outputting the write enable signal WE* at the first level at a predetermined time after the write enable signal WE is applied to said input terminal, the predetermined time corresponding to the time when the data $D_{in}*$ is output at said output terminal of said data input circuit in response to the first level of the write enable signal WE.

6. The semiconductor memory device according to claim 5, wherein said timing circuit comprises:

a delay circuit for delaying output of the write enable signal WE* until data is output at said output terminal of said data input circuit; and a logic circuit, having two input terminals to one of which the write enable signal WE is supplied, and to the other of which the write enable signal WE delayed by said delay circuit is supplied, for immediately outputting the write enable signal WE* at a second level when the write enable signal WE is at the second level, and for outputting the write enable signal WE* at the first level in accordance with a delay time of said delay circuit, when the write enable signal WE is at the first level.

7. The semiconductor memory device according to claim 6, wherein said logic circuit includes a NOR circuit.

8. The semiconductor memory device according to claim 6, wherein said timing circuit is responsive to a second level of the write enable signal WE for outputting the write enable signal WE* at the second level simultaneously with the application of said write enable signal WE at the second level to said input terminal.

9. The semiconductor memory device according to claim 6, wherein said memory cells of said first and second memory cell arrays are nonvolatile memory cells.

10. The semiconductor memory device according to claim 1, wherein said memory cells are nonvolatile memory cells.

11. A semiconductor memory device, comprising:

a data input circuit having a first input terminal for receiving input data, a second input terminal for receiving a write enable signal, and an output terminal for outputting data corresponding to the input data in response to a first level of the write enable signal;

memory cells for storing data;

programming means having an operational state for programming data corresponding to the data at said output terminal of said data input circuit into said memory cells, and a non-operational state; and a timing circuit having an input terminal applied with the write enable signal and an output terminal connected to said programming means, said timing circuit being responsive to the first level of the write enable signal for outputting a first signal for initiating the operational state of said programming means at a time after the write enable signal at the first level is applied to said input terminal of said timing circuit, and said timing circuit being responsive to a second level of the write enable signal for outputting a second signal for initiating the non-operational state of said programming means simultaneously with the application of the write enable signal at the second level to said input terminal of said timing circuit.

* * * * *